(12) United States Patent
Chang et al.

(10) Patent No.: US 12,074,250 B2
(45) Date of Patent: Aug. 27, 2024

(54) DISPLAY SUBSTRATE AND METHOD OF MANUFACTURING THE SAME, AND DISPLAY DEVICE

(71) Applicants: BOE MLED TECHNOLOGY CO., LTD., Beijing (CN); BOE TECHNOLOGY GROUP CO., LTD., Beijing (CN)

(72) Inventors: Kangle Chang, Beijing (CN); Pei Li, Beijing (CN); Jinpeng Li, Beijing (CN); Lu Yu, Beijing (CN); Jian Sang, Beijing (CN); Haiwei Sun, Beijing (CN); Ming Chen, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 583 days.

(21) Appl. No.: 17/291,829

(22) PCT Filed: Jan. 23, 2020

(86) PCT No.: PCT/CN2020/073961
§ 371 (c)(1),
(2) Date: May 6, 2021

(87) PCT Pub. No.: WO2021/147064
PCT Pub. Date: Jul. 29, 2021

(65) Prior Publication Data
US 2022/0052225 A1    Feb. 17, 2022

(51) Int. Cl.
*H01L 33/00* (2010.01)
*H01L 25/075* (2006.01)
*H01L 33/10* (2010.01)

(52) U.S. Cl.
CPC ......... *H01L 33/10* (2013.01); *H01L 25/0753* (2013.01); *H01L 33/005* (2013.01)

(58) Field of Classification Search
CPC ......... H01L 33/00; H01L 33/10; H01L 33/46; H01L 33/48; H01L 33/58; H01L 33/60;
(Continued)

(56) References Cited

U.S. PATENT DOCUMENTS

| 2002/0190643 | A1 | 12/2002 | Cummings et al. |
| 2011/0266573 | A1* | 11/2011 | Kim ............... H01L 33/405 |
| | | | 257/E33.072 |

(Continued)

FOREIGN PATENT DOCUMENTS

| CN | 106199771 A | 12/2016 |
| CN | 106531770 A | 3/2017 |

(Continued)

OTHER PUBLICATIONS

First Office Action on the Taiwanese Patent Application No. 111143338 issued by the Taiwanese Patent Office on May 2, 2023.
(Continued)

*Primary Examiner* — Chuong A Luu
(74) *Attorney, Agent, or Firm* — IP & T GROUP LLP

(57) ABSTRACT

A display substrate includes a base, a plurality of light-emitting devices disposed on a side of the base, and a light adjustment layer. The plurality of light-emitting devices are spaced apart from each other. At least part of the light adjustment layer is located in gaps among the plurality of light-emitting devices, so that side walls of at least one of the plurality of light-emitting devices are surrounded by the light adjustment layer. A material of the light adjustment layer includes a light-absorbing material. The light adjustment layer is configured to absorb light incident on the light adjustment layer.

20 Claims, 9 Drawing Sheets

(58) Field of Classification Search
CPC ... H01L 33/005; H01L 33/486; H01L 25/075; H01L 25/0753; H01L 25/16; H01L 25/167; H01L 27/12; H01L 27/1214; H01L 2933/0058; H01L 2933/0083
USPC .......................................................... 257/79
See application file for complete search history.

(56) References Cited

U.S. PATENT DOCUMENTS

| | | | |
|---|---|---|---|
| 2012/0235169 | A1 | 9/2012 | Seko et al. |
| 2016/0178812 | A1 | 6/2016 | Gao et al. |
| 2017/0194602 | A1 | 7/2017 | Cui et al. |
| 2018/0102348 | A1 | 4/2018 | Haiberger et al. |
| 2019/0035974 | A1 | 1/2019 | Li et al. |
| 2019/0081281 | A1 | 3/2019 | Chesterman et al. |
| 2019/0088726 | A1 | 3/2019 | Zhang |
| 2019/0115329 | A1 | 4/2019 | Min et al. |
| 2019/0148274 | A1 | 5/2019 | Yu et al. |
| 2019/0237637 | A1 | 8/2019 | Cheng et al. |
| 2019/0244938 | A1 | 8/2019 | Bang et al. |
| 2020/0144460 | A1 | 5/2020 | Onuma et al. |
| 2020/0152612 | A1 | 5/2020 | Chen et al. |
| 2020/0176650 | A1* | 6/2020 | Achi ..................... H01L 33/505 |
| 2020/0279979 | A1 | 9/2020 | Lee et al. |
| 2020/0287167 | A1 | 9/2020 | Tian et al. |

FOREIGN PATENT DOCUMENTS

| | | |
|---|---|---|
| CN | 107039410 A | 8/2017 |
| CN | 107359175 A | 11/2017 |
| CN | 108598278 A | 9/2018 |
| CN | 108682312 A | 10/2018 |
| CN | 108878626 A | 11/2018 |
| CN | 109671365 A | 4/2019 |
| CN | 109887977 A | 6/2019 |
| CN | 210692541 U | 6/2020 |
| EP | 3506353 A2 | 7/2019 |
| EP | 3 837 470 A1 | 6/2021 |
| JP | 2009258455 A | 11/2009 |
| JP | 2019075528 A | 5/2019 |
| KR | 20190038365 A | 4/2019 |
| TW | I251850 B | 3/2006 |
| TW | 201917914 A | 5/2019 |

OTHER PUBLICATIONS

Second Office Action on the Chinese Patent Application No. 202080000076.8 issued by the Chinese Patent Office on May 6, 2023.
Extended European Search Report for European Patent Application No. 20886175.7 issued by European Patent Office on Jan. 2, 2023.
Office Action for the Taiwanese Patent Application No. 111143338 issued by the Taiwanese Patent Office on Oct. 13, 2023.
Office Action for the Japanese Patent Application No. 2021-576247 issued by the Japanese Patent Office on Sep. 14, 2023.
Office Action for the Chinese Patent Application No. 202080000076.8 issued by the Chinese Patent Office on Sep. 1, 2023.
Notification Letter of Review Opinion issued by the Intellectual Property Bureau of the Ministry of Economic Affairs on Aug. 6, 2021.
Examination Report for the Indian Patent Application No. 202147050994 issued by the Indian Patent Office on Aug. 26, 2022.
Fisrt Office Action Issued by the Chinese Patent Office for Application No. 202080000076.8 on Oct. 21, 2022.
Extended European Search Report for European Patent Application No. 20886175.7 issued by European Patent Office on Jan. 1, 2023.
Office Action for the Japanese Patent Application No. 2021-576247 issued by the Japanese Patent Office on Sep. 26, 2023.
Notice of Reasons for Refusal for the Japanese Patent Application No. 2021-576247 issued by the Japanese Patent Office on Mar. 5, 2024.
Office Action for the Korean Patent Application No. 10-2021-7041908 issued by the Korean Intellectual Property Office on Mar. 4, 2024.
Hearing Notice for the Indian Patent Application No. 202147050994 issued by the Office of the Controller General of Patents, Designs and Trade Marks on Jan. 5, 2024.

* cited by examiner

DISPLAY SUBSTRATE AND METHOD OF MANUFACTURING THE SAME, AND DISPLAY DEVICE

CROSS-REFERENCE TO RELATED APPLICATION

This application is a national phase entry under 35 USC 371 of International Patent Application No. PCT/CN2020/073961, filed on Jan. 23, 2020, which is incorporated herein by reference in its entirety.

TECHNICAL FIELD

The present disclosure relates to the field of display technologies, and in particular, to a display substrate and a method of manufacturing the same, and a display device.

BACKGROUND

A mini light-emitting diode (Mini LED) refers to a light-emitting diode with a grain size of approximately 100 μm. Due to their many advantages such as self-luminescence, high efficiency, high brightness, high reliability, energy conservation and fast response, Mini LEDs can realize individual addressing of each pixel, and are applied to the fields of micro display, medium-size display such as mobile phones and television sets, and large-screen display such as cinema screens.

SUMMARY

In one aspect, a display substrate is provided. The display substrate includes a base, a plurality of light-emitting devices disposed on a side of the base, and a light adjustment layer. The plurality of light-emitting devices are spaced apart from each other. At least part of the light adjustment layer is located in gaps among the plurality of light-emitting devices, so that side walls of at least one of the plurality of light-emitting devices are surrounded by the light adjustment layer. A material of the light adjustment layer includes a light-absorbing material. The light adjustment layer is configured to absorb light incident on the light adjustment layer.

In some embodiments, a thickness of a portion of the light adjustment layer located in the gaps among the plurality of light-emitting devices is 0.5 to 1.5 times a thickness of the plurality of light-emitting devices.

In some embodiments, the material of the light adjustment layer includes at least one of a black ink, a black glue, or a black photoresist material.

In some embodiments, an absorption coefficient of the material of the light adjustment layer is $2\times10^{-5}$ $m^{-1}$ to 0.8 $m^{-1}$.

In some embodiments, a surface of the light adjustment layer away from the base is flush with surfaces of the plurality of light-emitting devices away from the base, or, is higher or lower than the surfaces of the plurality of light-emitting devices away from the base relative to the base in a thickness direction of the base.

In some embodiments, relative to the base, the surface of the light adjustment layer away from the base is 0 μm to 50 μm higher than the surfaces of the plurality of light-emitting devices away from the base in the thickness direction of the base. Or relative to the base, in the thickness direction of the base, a difference between a distance from the surfaces of the plurality of light-emitting devices away from the base to the base, and a distance from the surface of the light adjustment layer away from the base to the base is greater than 0 μm and less than or equal to 15 μm.

In some embodiments, the light adjustment layer includes a first sub-light adjustment layer located in the gaps among the plurality of light-emitting devices, and a second sub-light adjustment layer disposed on a side of the first sub-light adjustment layer away from the base. A surface of the first sub-light adjustment layer away from the base is flush with surfaces of the plurality of light-emitting devices away from the base, or is higher or lower than the surfaces of the plurality of light-emitting devices away from the base relative to the base. A material of the first sub-light adjustment layer includes a reflective material. The first sub-light adjustment layer is configured to reflect light incident from the light-emitting devices to the first sub-light adjustment layer back into the light-emitting devices. A surface of the second sub-light adjustment layer away from the base is flush with the surfaces of the plurality of light-emitting devices away from the base, or is higher than the surfaces of the plurality of light-emitting devices away from the base relative to the base. A material of the second sub-light adjustment layer includes the light-absorbing material. The second sub-light adjustment layer is configured to absorb light incident on the second sub-light adjustment layer.

In some embodiments, a reflectivity of the reflective material in the first sub-light adjustment layer is 85% to 95%.

In some embodiments, the material of the first sub-light adjustment layer includes at least one of a white ink, a white glue, or a metal material.

In some embodiments, in a thickness direction of the base, a difference between a distance from the surface of the first sub-light adjustment layer away from the base to the base, and a distance from the surfaces of the plurality of light-emitting devices away from the base to the base is −15 μm to 15 μm.

In some embodiments, a thickness of the second sub-light adjustment layer is 10 μm to 15 μm.

In some embodiments, an orthogonal projection of the second sub-light adjustment layer on the base is non-overlapping with or substantially non-overlapping with orthogonal projections of the plurality of light-emitting devices on the base. Or, the orthogonal projections of the plurality of light-emitting devices on the base are located within the orthogonal projection of the second sub-light adjustment layer on the base.

In some embodiments, the display substrate further includes a light reflecting layer that covers side walls of each of the plurality of light-emitting devices.

In another aspect, a method of manufacturing a display substrate is provided. The method of manufacturing the display substrate includes: providing a base; providing a plurality of light-emitting devices spaced apart from each other on a side of the base; and forming a light adjustment layer on the base provided with the plurality of light-emitting devices. At least part of the light adjustment layer is located in gaps among the plurality of light-emitting devices, so that side walls of at least one of the plurality of light-emitting devices are surrounded by the light adjustment layer. A material of the light adjustment layer includes a light-absorbing material. The light adjustment layer is configured to absorb light incident on the light adjustment layer.

In some embodiments, forming the light adjustment layer on the base provided with the plurality of light-emitting devices, includes: forming a first sub-light adjustment layer in the gaps among the plurality of light-emitting devices; and forming a second sub-light adjustment layer on a side of the first sub-light adjustment layer away from the base. A surface of the first sub-light adjustment layer away from base is flush with surfaces of the plurality of light-emitting devices away from the base, or is higher or lower than the surfaces of the plurality of light-emitting devices away from the base relative to the base. A material of the first sub-light adjustment layer includes a reflective material. A surface of the second sub-light adjustment layer away from the base is flush with the surfaces of the plurality of light-emitting devices away from the base, or is higher than the surfaces of the plurality of light-emitting devices away from the base relative to the base. A material of the second sub-light adjustment layer includes the light-absorbing material.

In some embodiments, the first sub-light adjustment layer is formed by any one of a glue dispensing process, a glue spraying process, or a 3D printing process. The second sub-light adjustment layer is formed by any one of a glue dispensing process, a glue spraying process, a line coating process, a 3D printing process, a photolithography process, or an injection molding process.

In some embodiments, forming the light adjustment layer on the base provided with the plurality of light-emitting devices, includes: forming a light adjustment film in the gaps among the plurality of light-emitting devices and on a side of the plurality of light-emitting devices away from the base, a surface of the light adjustment film away from the base being higher than surfaces of the plurality of light-emitting devices away from the base relative to the base, and the light adjustment film including the light-absorbing material; and polishing the light adjustment film to reduce a thickness of the light adjustment film, so as to form the light adjustment layer.

In yet another aspect, a display device is provided. The display device includes the display substrate as described in some of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
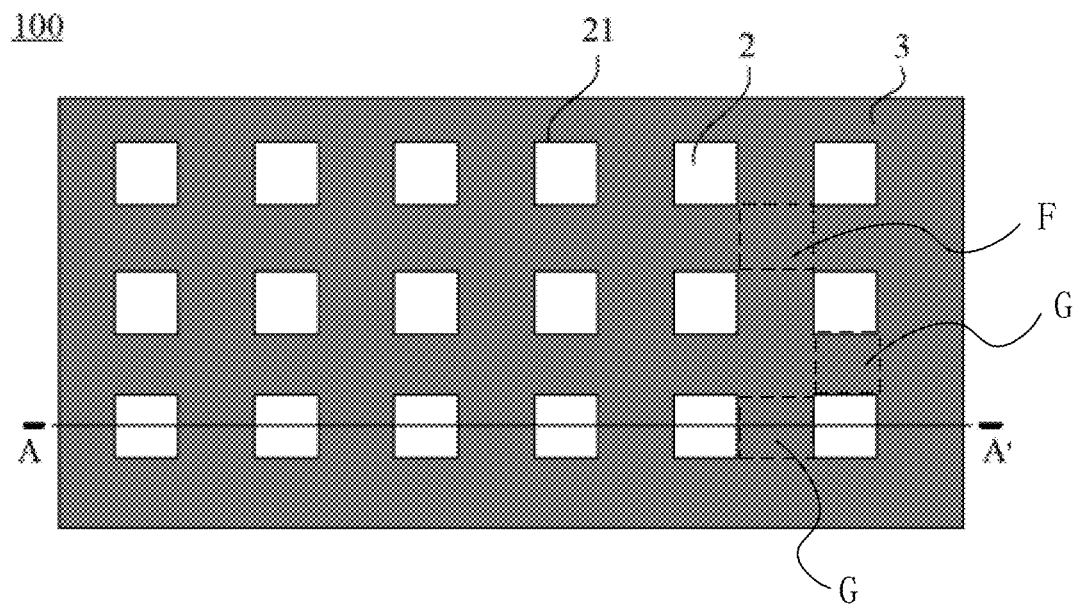
FIG. 1 is a top view of a display substrate, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", and "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has a same meaning as the phrase "at least one of A, B or C", and both include the following combinations of A, B and C: only A, only B, only C, a combination of A and B, a combination of A and C, a combination of B and C, and a combination of A, B and C.

Mini light-emitting diodes (Mini LEDs) may emit light of various colors, such as red, green, blue, or white. In a case where the Mini LEDs are applied to a display device, the Mini LEDs may be disposed in sub-pixel regions of the display device, and may be directly used for display as sub-pixels.

A base for providing electrical signals to the Mini LEDs is provided in the display device, and both the base and the Mini LEDs may reflect light incident on their respective surfaces. As such, when a display brightness of the display device is zero, a display surface of the display device may still display a brightness due to reflection of the base and the Mini LEDs, resulting in a decrease in a contrast of the display device.

Some embodiments of the present disclosure provide a display substrate 100. As shown in FIGS. 1 to 9, the display substrate 100 includes a base 1, a plurality of light-emitting devices 2 disposed on a side of the base 1, and a light adjustment layer 3.

In some examples, each of the plurality of light-emitting devices 2 is a light-emitting diode (LED), a Mini LED or a micro light-emitting diode (Micro LED).

Figure 9:
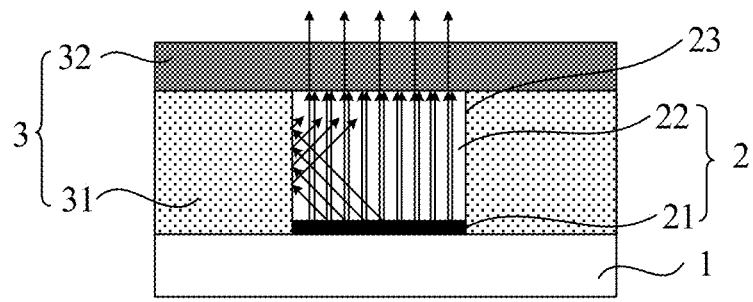
FIG. 9 is an optical path diagram of a display substrate, in accordance with some embodiments of the present disclosure.

In some examples, as shown in FIG. 9, each light-emitting device 2 includes a light-emitting layer 21 configured to emit light, and a transmissive layer 22 disposed on a side of the light-emitting layer 21. After the light-emitting device 2 is arranged on the base 1, the transmissive layer 22 is arranged on a side of the light-emitting layer 21 away from the base 1. The light emitted from the light-emitting layer 21 passes through the transmissive layer 22 first, and then exits from a display side. When passing through the transmissive layer 22, the light emitted from the light-emitting layer 21 is scattered and exits in various directions. In this way, a density of light may be reduced, and a uniformity of the light emitted from the light-emitting device 2 may be improved. For example, the transmissive layer 22 includes a sapphire material with a refractive index of 1.78. In some examples, the transmissive layer 22 may also include air.

The base 1 has a plurality of sub-pixel regions arranged in an array. Each light-emitting device 2 is correspondingly disposed in a sub-pixel region, and the plurality of light-emitting devices 2 are spaced apart from each other.

In some examples, the base 1 is configured to provide a driving voltage for each light-emitting device 2, so that the light-emitting device 2 can emit light when driven by the driving voltage.

For example, the base 1 may include a base substrate and a plurality of pixel driving circuits disposed on the base substrate. The plurality of pixel driving circuits are in one-to-one correspondence with the plurality of sub-pixel regions. In this way, each light-emitting device 2 can emit light when driven by a driving voltage provided by a corresponding pixel driving circuit.

The pixel driving circuit may be of various structures, such as "2T1C", "6T1C", "7T1C", "6T2C", or "7T2C". Herein, "T" represents a thin film transistor, and the number before "T" represents the number of thin film transistors, "C" represents a storage capacitor, and the number before "C" represents the number of storage capacitors. Among the plurality of thin film transistors included in the pixel driving circuit of each structure, one thin film transistor is a driving transistor.

Of course, in the embodiments of the present disclosure, in addition to the driving method described above, other driving methods may be adopted to drive the plurality of light-emitting devices 2. For example, the plurality of light-emitting devices 2 may also be driven by a passive driving method or an integrated circuit (IC) driving method.

The base substrate of the base 1 may be of various structures. For example, the base substrate is a flexible base substrate, such as a polyethylene terephthalate (PET) base substrate, a polyethylene naphthalate (PEN) base substrate, or a polyimide (PI) base substrate. For example, the base substrate is a rigid base substrate, such as a glass base substrate or a polymethyl methacrylate (PMMA) base substrate.

The plurality of light-emitting devices 2 are spaced apart from each other, which means there are gaps among the plurality of light-emitting devices 2. As shown in FIGS. 2 to 5, 7 and 8, at least part of the light adjustment layer 3 is located in the gaps among the plurality of light-emitting devices 2, so that side walls 23 of at least one of the plurality of light-emitting devices 2 are surrounded by the light adjustment layer 3. The side walls 23 of the light-emitting device 2 refer to surfaces of the light-emitting device 2 perpendicular or substantially perpendicular to the base 1.

There are many ways to arrange that at least part of the light adjustment layer 3 is located in the gaps among the plurality of light-emitting devices 2.

Figure 3:
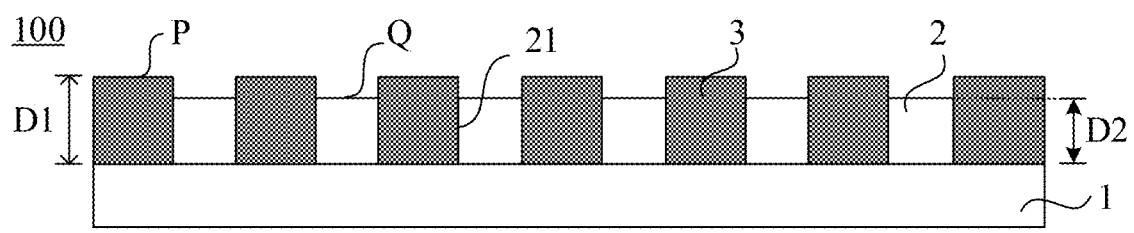
FIG. 3 is yet another cross-sectional view of the display substrate shown in FIG. 1 taken along the A-A' direction.
Figure 5:
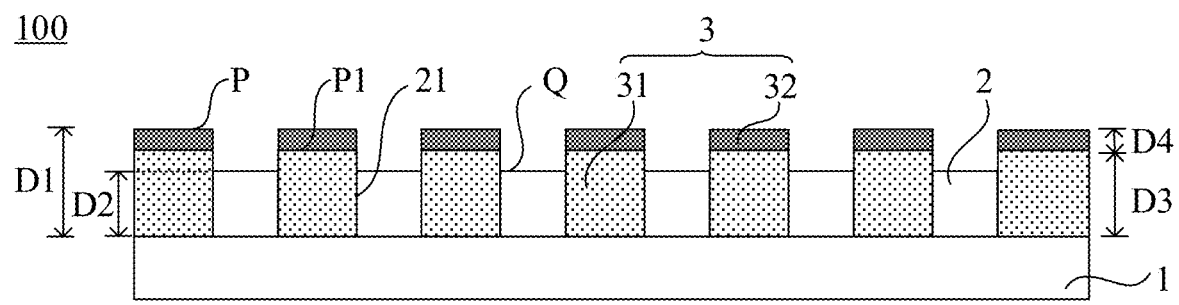
FIG. 5 is yet another cross-sectional view of the display substrate shown in FIG. 1 taken along the A-A' direction.
Figure 7:
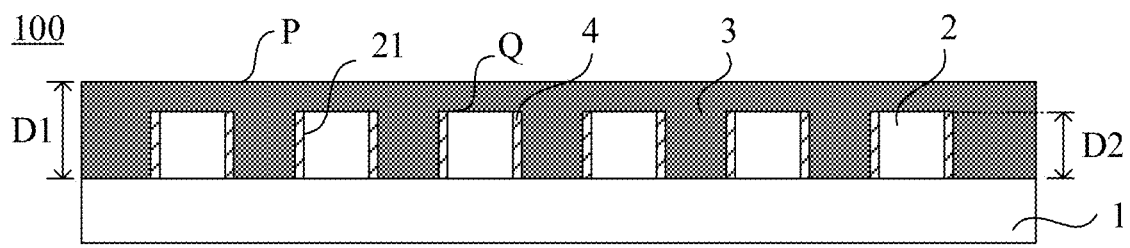
FIG. 7 is a cross-sectional view of the display substrate shown in FIG. 6 taken along the B-B' direction.
Figure 8:
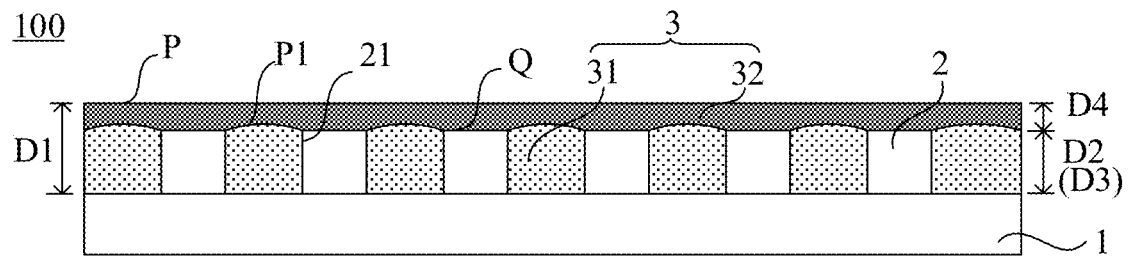
FIG. 8 is another cross-sectional view of the display substrate shown in FIG. 6 taken along the B-B' direction.

For example, a portion of the light adjustment layer 3 is located in the gaps among the plurality of light-emitting devices 2. In this case, as shown in FIGS. 3 and 5, in a direction in which the light-emitting device 2 extends perpendicular to the base 1, the other portion of the light adjustment layer 3 may be located in regions between two adjacent light-emitting devices 2; or, as shown in FIGS. 7 and 8, the other portion of the light adjustment layer 3 may further be located on surface(s) of the at least one light-emitting device 2 away from the base 1. In this way, the light adjustment layer 3 may not only surround the side walls 23 of at least one of the plurality of light-emitting devices 2, but may also cover the surface(s) of the at least one light-emitting device 2 away from the base 1.

Figure 4:
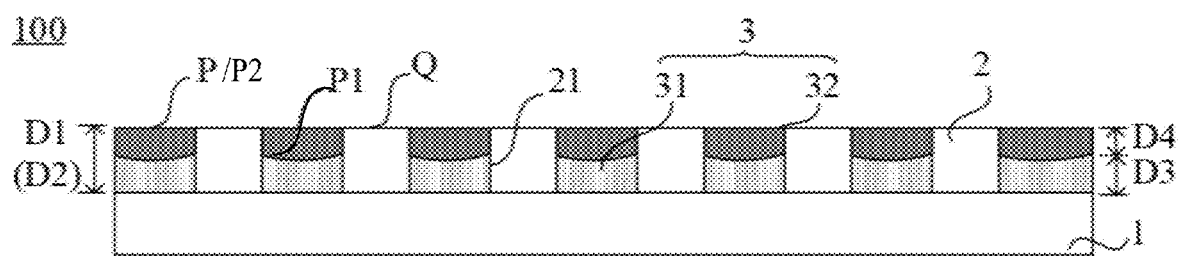
FIG. 4 is yet another cross-sectional view of the display substrate shown in FIG. 1 taken along the A-A' direction.

For another example, as shown in FIGS. 2 and 4, all of the light adjustment layer 3 is located in the gaps among the plurality of light-emitting devices 2, so as to surround the side walls 23 of at least one of the plurality of light-emitting devices 2.

By providing the light adjustment layer 3, it may be possible to protect the side walls 23, or even the surface(s), away from the base 1, of at least one of the plurality of light-emitting devices 2, and thus avoid a situation in which the side walls 23, or even the surface(s), away from the base 1, of the at least one light-emitting device 2 are peeled off or damaged due to scratching in a production process thereof, thereby ensuring the quality of the at least one light-emitting device 2. Moreover, by providing the light adjustment layer 3, it may further be possible to fix the at least one light-emitting device 2 on the base 1, thereby reducing a possibility of or even avoiding a situation in which the light-emitting device 2 becomes loose and cannot emit light well, and thus ensuring a good display effect of the display substrate 100.

In some examples, a material of the light adjustment layer 3 includes a light-absorbing material. The light adjustment layer 3 is configured to absorb light incident on the light adjustment layer 3. This means that much of the light incident on the light adjustment layer 3 will be absorbed, which may effectively reduce an amount of light reflected by the light adjustment layer 3.

Therefore, in the display substrate 100 provided by the embodiments of the present disclosure, by arranging the light adjustment layer 3 in a way that at least part of the light adjustment layer 3 is located in the gaps among the plurality of light-emitting devices 2, it may not only be possible to protect the at least one of the plurality of light-emitting devices 2 by preventing the at least one light-emitting device 2 from being peeled off or damaged due to scratching in the production process and thus ensuring its quality, but it may also be possible to fix the at least one light-emitting device 2 and thus ensure the good display effect of the display substrate 100.

Moreover, in the display substrate 100 provided by the embodiments of the present disclosure, the material of the light adjustment layer 3 includes the light-absorbing material. In this way, the light adjustment layer 3 may be used to absorb the light incident on the light adjustment layer 3, so as to reduce the amount of light reflected by the light adjustment layer 3. Since at least part of the light adjustment layer 3 is disposed in the gaps among the plurality of light-emitting devices 2, the light adjustment layer 3 may be able to shield the base 1, and the side walls 23 and even the surface(s), away from the base 1, of the at least one light-emitting device 2. In this way, it may be possible to reduce the amount of light reflected by the base 1 and the at least one light-emitting device 2, and reduce the amount of light that escapes to the outside (that is, to the air opposite to a display surface of the display substrate 100) due to reflection of the base 1 and the at least one light-emitting device 2. Therefore, the display surface of the display substrate 100 may be darker when the display brightness of the display substrate 100 is zero.

In addition, in the embodiments of the present disclosure, by adjusting the driving voltage provided to the light-emitting device 2, it may be possible to make the brightness displayed by the display substrate the same as a brightness thereof in a case where the light adjustment layer 3 is not provided. This means that in the embodiments of the present disclosure, it may not only be possible to ensure that the display substrate 100 can display a maximum gray scale brightness thereof in the case where the light adjustment layer 3 is not provided, but it may also be possible to enable the display substrate 100 to display a minimum gray scale thereof in the case where the light adjustment layer 3 is not provided. Therefore, a difference between a brightest state and a darkest state may be increased, which effectively increases the contrast of the display substrate 100.

In the embodiments of the present disclosure, the description that the material of the light adjustment layer 3 includes the light-absorbing material includes various arrangements. That is, the material of the entire light adjustment layer 3 includes the light-absorbing material. Or the material of at least part of the light adjustment layer 3 includes the light-absorbing material. Which of the two arrangements is adopted is related to the structure of the light adjustment layer 3.

In some embodiments, as shown in FIGS. 2, 3, and 7, the light adjustment layer 3 is of a single-layer film structure, and the material of the entire light adjustment layer 3 includes the light-absorbing material.

For example, the material of the light adjustment layer 3 includes at least one of a black ink, a black glue, or a black photoresist material, but the material of the light adjustment layer 3 is not limited thereto. Here, the light-absorbing material is at least one of a black ink, a black glue, or a black photoresist material. The black glue is, for example, a silica gel doped with black powders. For example, in the black glue, 0.5 g to 1.5 g of black powder is doped per 100 g of silica gel.

In some examples, as shown in FIGS. 2 to 5, 7 and 8, a thickness D1 of a portion of the light adjustment layer 3 located in the gaps among the plurality of light-emitting devices 2 (that is, a dimension thereof in a direction perpendicular to a surface of the base 1 facing the light-emitting devices 3) is 0.5 to 1.5 times a thickness D2 of the plurality of light-emitting devices 3 (that is, a dimension thereof in the direction perpendicular to a surface of the base 1 facing the light-emitting devices 3).

Here, as shown in FIGS. 1, 2 and 3, the portion of the light adjustment layer 3 located in the gaps among the plurality of light-emitting devices 2 refers to portions G of the light adjustment layer 3 each located between two adjacent light-emitting devices 2 of the plurality of light-emitting devices 2 and portions F of the light adjustment layer 3 each located among four adjacent light-emitting devices 2 of the plurality of light-emitting devices 2. This portion includes a portion of the light adjustment layer 3 located between two adjacent light-emitting devices 2, and does not include a portion of the light adjustment layer 3 located on a side of the light-emitting devices 2 facing away from the base 1.

Figure 2A:
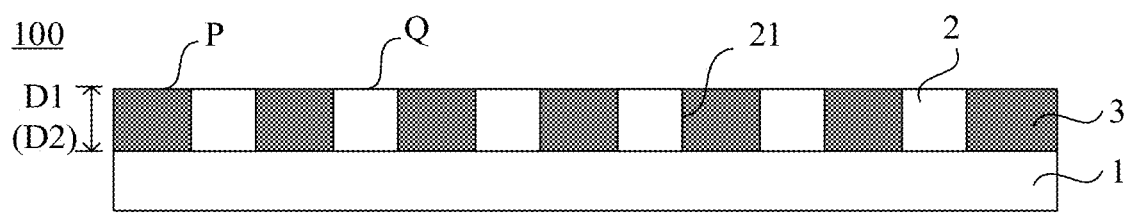
FIG. 2A is a cross-sectional view of the display substrate shown in FIG. 1 taken along the A-A' direction.

For example, as shown in FIG. 2A, the thickness D1 of the portion of the light adjustment layer 3 located in the gaps among the plurality of light-emitting devices 2 is 1 time the thickness D2 of the plurality of light-emitting devices 2. That is, the thickness D1 of the portion of the light adjustment layer 3 located in the gaps among the plurality of light-emitting devices 2 is approximately equal to the thickness D2 of the plurality of light-emitting devices 2. In this case, as shown in FIG. 2A, a surface P of the light adjustment layer 3 away from the base 1 is flush with surfaces Q of the plurality of light-emitting devices 2 away from the base 1.

Figure 2B:
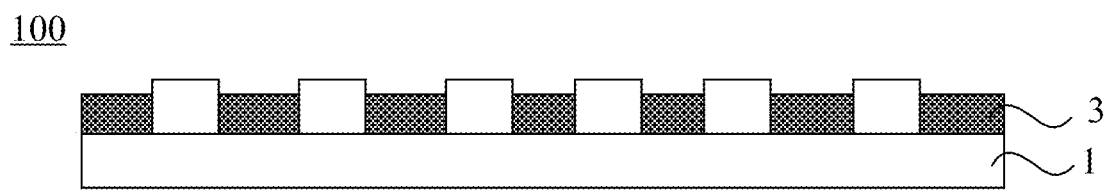
FIG. 2B is another cross-sectional view of the display substrate shown in FIG. 1 taken along the A-A' direction.

For example, as shown in FIG. 2B, the thickness D1 of the portion of the light adjustment layer 3 located in the gaps among the plurality of light-emitting devices 2 is greater than or equal to 0.5 times the thickness D2 of the plurality of light-emitting devices 2 and less than 1 time the thickness D2 of the plurality of light-emitting devices 2. That is, the thickness D1 of the portion of the light adjustment layer 3 located in the gaps among the plurality of light-emitting devices 2 is less than the thickness D2 of the plurality of light-emitting devices 2. In this case, the surface P of the light adjustment layer 3 away from the base 1 is lower than the surfaces Q of the plurality of light-emitting devices 2 away from the base 1. For example, relative to the base 1, the surface P of the light adjustment layer 3 away from the base 1 is 0 μm to 15 μm lower than the surfaces Q of the plurality of light-emitting devices 2 away from the base 1. For example, relative to the base 1, the surface P of the light adjustment layer 3 away from the base 1 is 5 μm, 7 μm, 10 μm, 13 μm, or 15 μm lower than the surfaces Q of the plurality of light-emitting devices 2 away from the base 1. In addition, in a case where the surface P of the light adjustment layer 3 away from the base 1 is 0 μm lower than the surfaces Q of the plurality of light-emitting devices 2 away from the base 1, it means that the surfaces P and Q are flush with each other.

It will be noted that, in the description that the light adjustment layer 3 is configured to absorb light incident on the light adjustment layer 3, the light mentioned herein includes not only light coming from the outside and incident on the light adjustment layer 3, but also light emitted by the light-emitting devices 2 and incident on the light adjustment layer 3.

A light absorption formula of the light adjustment layer 3 is $I=I_0 \times C^{-\alpha L}$. Herein, $I_0$ represents a light intensity of light that hasn't entered the light adjustment layer 3, I represents a light intensity of light that has passed through and come out of the light adjustment layer 3, a represents an absorption coefficient of the light adjustment layer 3, and L represents an optical distance of light traveling in the light adjustment layer 3. It can be seen from the formula that, the shorter the optical distance the light travels in the light adjustment layer 3, the less light the light adjustment layer 3 absorbs.

In the embodiments of the present disclosure, the surface P of the light adjustment layer 3 away from the base 1 is set to be flush with or lower than the surfaces Q of the light-emitting devices 2 away from the base 1. In this way, it may not only be possible to use the light adjustment layer 3 to protect and fix the light-emitting devices 2, so as to ensure the display effect of the display substrate 100, but it may also be possible to shorten the optical distance the light emitted by the light-emitting devices 2 travels in the light adjustment layer 3, so as to reduce the absorption of light emitted by the light-emitting devices 2 by the light adjustment layer 3, and reduce the loss of light. In addition, since this arrangement may reduce the loss of light, on the premise of ensuring a display brightness of the display substrate 100, it may be possible to avoid providing a large driving voltage to the light-emitting device 2 and reduce power consumption.

For example, as shown in FIG. 3, the thickness D1 of the portion of the light adjustment layer 3 located in the gaps among the plurality of light-emitting devices 2 is greater than 1 time the thickness D2 of the plurality of light-emitting devices 2 and less than or equal to 1.5 times the thickness D2 of the plurality of light-emitting devices 2. That is, the thickness D1 of the portion of the light adjustment layer 3 located in the gaps among the plurality of light-emitting devices 2 is greater than the thickness D2 of the light-emitting devices 2. In this case, as shown in FIGS. 3 and 7, relative to the base 1, the surface P of the light adjustment layer 3 away from the base 1 is higher than the surfaces Q of the plurality of light-emitting devices 2 away from the base 1.

In a case where the surface P of the light adjustment layer 3 away from the base 1 is higher than the surfaces Q of the plurality of light-emitting devices 2 away from the base 1 relative to the base 1, the light adjustment layer 3 may be arranged in various manners.

For example, as shown in FIGS. 1 and 3, the light adjustment layer 3 surrounds the side walls 23 of each light-emitting device 2, and does not cover the surfaces Q of the light-emitting devices 2 facing away from the base 1.

Figure 6:
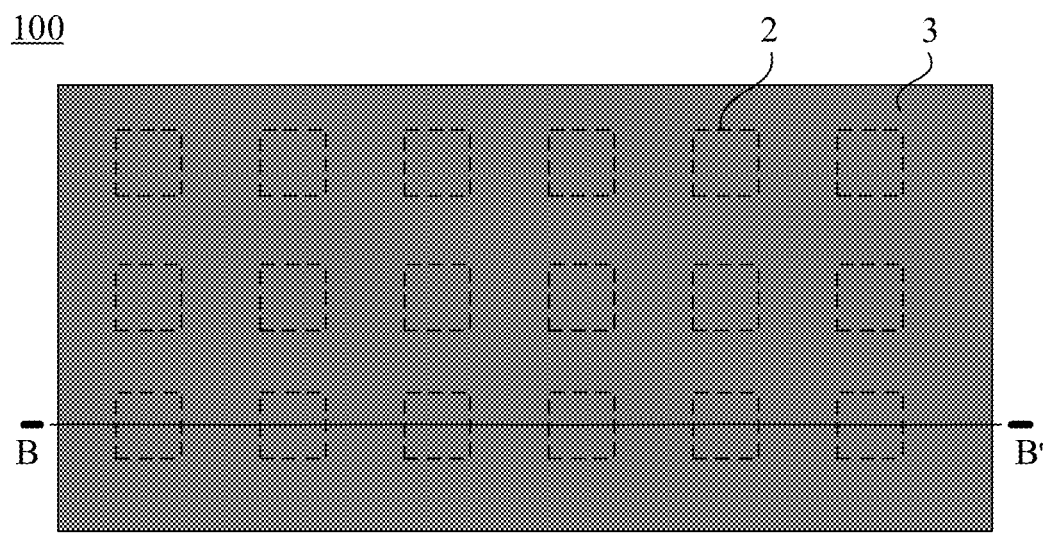
FIG. 6 is a top view of another display substrate, in accordance with some embodiments of the present disclosure.

For another example, as shown in FIGS. 6 and 7, orthogonal projections of the plurality of light-emitting devices 2 on the base 1 are located within an orthogonal projection of the light adjustment layer 3 on the base 1. The light adjustment layer 3 surrounds the side walls 23 of each light-emitting device 2, and covers the surfaces Q of the light-emitting devices 2 facing away from the base 1.

In the embodiments of the present disclosure, by arranging that the surface P of the light adjustment layer 3 away from the base 1 is higher than the surfaces Q of the plurality of light-emitting devices 2 away from the base 1, it may be possible to reduce or even avoid the reflection, by the light-emitting devices 2, of light coming from the outside and incident on the light-emitting devices 2. In this way, it may be possible to better ensure that the display surface is darker when the display brightness of the display substrate 100 is zero, and thus effectively improve the contrast of the display substrate 100.

In the examples, relative to the base 1, how much higher the surface P of the light adjustment layer 3 away from the base 1 is than the surfaces Q of the plurality of light-emitting devices 2 away from the base 1 may be set according to actual needs, which is subject to a rule that not only the contrast of the display substrate 100 can be effectively improved, but also large loss of light can be avoided.

For example, relative to the base 1, the surface P of the light adjustment layer 3 away from the base 1 is 0 μm to 50 μm higher than the surfaces Q of the plurality of light-emitting devices 2 away from the base 1. For example, relative to the base 1, the surface P of the light adjustment layer 3 away from the base 1 is 10 μm, 20 μm, 30 μm, 40 μm, or 50 μm higher than the surfaces Q of the plurality of light-emitting devices 2 away from the base 1. In addition, in a case where the surface P of the light adjustment layer 3 away from the base 1 is 0 μm higher than the surfaces Q of the plurality of light-emitting devices 2 away from the base 1, it means that the surfaces P and Q are flush with each other.

It will be noted that, according to the light absorption formula of the light adjustment layer 3, the absorption of light by the light adjustment layer 3 is also related to the absorption coefficient of the light adjustment layer 3. The lower the absorption coefficient of the light adjustment layer 3, the less light the light adjustment layer 3 absorbs.

For example, the absorption coefficient of the light adjustment layer 3 is $2 \times 10^{-5}$ m$^{-1}$ to 0.8 m$^{-1}$. In this way, it may be possible to reduce the absorption, by the light adjustment layer 3, of the light emitted from the light-emitting devices 2, and thus reduce the loss of light. Therefore, on the premise of ensuring the display brightness of the display substrate 100, it may be possible to avoid supplying a large driving voltage to the light-emitting device 2 and reduce power consumption.

In some other embodiments, as shown in FIGS. 4, 5, and 8, the light adjustment layer 3 is composed of multiple layers of films that are stacked together, and a material of at least one layer of film of the light adjustment layer 3 includes the light-absorbing material.

In some examples, as shown in FIGS. 4, 5 and 8, the light adjustment layer 3 is composed of two layers of films that are stacked together. The light adjustment layer 3 includes a first sub-light adjustment layer 31 located in the gaps among the plurality of light-emitting devices 2. A material of the first sub-light adjustment layer 31 includes a reflective material. The first sub-light adjustment layer 31 is configured to reflect light incident from the light-emitting devices 2 to the first sub-light adjustment layer 31 back into the light-emitting devices 2.

Herein, the arrangement that the first sub-light adjustment layer 31 is located in the gaps among the plurality of light-emitting devices 2 includes: part or all of the first sub-light adjustment layer 31 is located in the gaps among the plurality of light-emitting devices 2.

For example, the entire first sub-light adjustment layer 31 is located in the gaps among the plurality of light-emitting devices 2. As shown in FIG. 4, relative to the base 1, a surface P1 of the first sub-light adjustment layer 31 away from the base 1 is lower than the surfaces Q of the plurality of light-emitting devices 2 away from the base 1, and the first sub-light adjustment layer 31 can surround part of the side walls 23 of the light-emitting devices 2. Or, as shown in FIG. 8, the surface P1 of the first sub-light adjustment layer 31 away from the base 1 is flush with the surfaces Q of the plurality of light-emitting devices 2 away from the base 1, and the first sub-light adjustment layer 31 can surround the side walls 23 of the light-emitting devices 2.

For example, part of the first sub-light adjustment layer 31 is located in the gaps among the plurality of light-emitting devices 2. As shown in FIG. 5, relative to the base 1, the surface P1 of the first sub-light adjustment layer 31 away from base 1 is higher than the surfaces Q of the plurality of light-emitting devices 2 away from the base 1, and first sub-light adjustment layer 31 can surround the side walls 23 of the light-emitting devices 2. In this case, as shown in FIG. 5, an orthogonal projection of the first sub-light adjustment layer 31 on the base 1 is non-overlapping with the orthogonal projections of the plurality of light-emitting devices 2 on the base 1.

The material of the first sub-light adjustment layer 31 includes the reflective material. That is, the first sub-light adjustment layer 31 can reflect the light incident on the first sub-light adjustment layer 31. For example, as shown in FIG. 9, the first sub-light adjustment layer 31 surrounds the side walls 23 of each light-emitting device 2, and therefore the light emitted by the light-emitting device 2 that is incident on the side walls 23 of the light-emitting device 2 will be reflected by the first sub-light adjustment layer 31 surrounding the side walls 23 back into the light-emitting device 2. That is, the light emitted by the light-emitting device 2 may be reflected at least once under the action of the first sub-light adjustment layer 31, such that the reflected light exits from the surface of the light-emitting device 2 facing away from the base 1. In this way, the absorption of light incident on the side walls 23 of the light-emitting device 2 may be reduced or even avoided, and the amount of light exiting from the surface of the light-emitting device 2 away from the base 1 may be increased, which helps to improve the light efficiency of the display substrate 100 and reduce the power consumption of the display substrate 100.

In some examples, as shown in FIGS. 4, 5 and 8, the light adjustment layer 3 further includes a second sub-light adjustment layer 32 disposed on a side of the first sub-light adjustment layer 31 away from the base 1. A material of the second sub-light adjustment layer 32 includes the light-absorbing material. The second sub-light adjustment layer 32 is configured to absorb light incident on the second sub-light adjustment layer 32.

Herein, the arrangement that the second sub-light adjustment layer 32 is disposed on the side of the first sub-light adjustment layer 31 away from the base 1 includes but is not limited to: the second sub-light adjustment layer 32 is disposed on a surface of the first sub-light adjustment layer 31 away from the base 1. That is, the first sub-light adjustment layer 31 and the second sub-light adjustment layer 32 are in direct contact with each other.

After the second sub-light adjustment layer 32 is arranged on the side of the first sub-light adjustment layer 31 away from the base 1, as shown in FIG. 4, a surface P2 of the second sub-light adjustment layer 32 away from the base 1 (that is, the surface P of the light adjustment layer 3 away from the base 1) is flush with the surfaces Q of the plurality of light-emitting devices 2 away from the base 1; or, as shown in FIGS. 5 and 8, relative to the base 1, the surface P2 of the second sub-light adjustment layer 32 away from the base 1 is higher than the surfaces Q of the plurality of light-emitting devices 2 away from the base 1.

The second sub-light adjustment layer 32 may be of various patterns.

For example, as shown in FIGS. 4 and 5, the orthogonal projection of the first sub-light adjustment layer 31 on the base 1 coincides with an orthogonal projection of the second sub-light adjustment layer 31 on the base 1. In this case, the orthogonal projection of the second sub-light adjustment layer 32 on the base 1 is non-overlapping with or substantially non-overlapping with the orthogonal projections of the plurality of light-emitting devices 2 on the base 1. In this way, the second sub-light adjustment layer 32 may be used to cover the first sub-light adjustment layer 31, and the second sub-light adjustment layer 32 may be used to absorb light coming from the outside and incident on the second sub-light adjustment layer 32, so as to prevent the light from reaching the first sub-light adjustment layer 31 and being reflected by the first sub-light adjustment layer 31 (which may affect the state of the display surface of the display substrate 100 when the display brightness is zero and thus affect the contrast of the display substrate 100).

For another example, as shown in FIG. 8, the orthogonal projection of the first sub-light adjustment layer 31 on the base 1 is located within the orthogonal projection of the second sub-light adjustment layer 32 on the base 1. In this case, the orthogonal projections of the plurality of light-emitting devices 2 on the base 1 are located within the orthogonal projection of the second sub-light adjustment layer 32 on the base 1. In this way, the second sub-light adjustment layer 32 may be used to cover the first sub-light adjustment layer 31 and the plurality of light-emitting devices 2, and the second sub-light adjustment layer 32 may be used to absorb light coming from the outside and incident on the second sub-light adjustment layer 32, so as to prevent the light from reaching the first sub-light adjustment layer 31 or the plurality of light-emitting devices 2 and being reflected by the first sub-light adjustment layer 31 or the plurality of light-emitting devices 2 (which may affect the state of the display surface of the display substrate 100 when the display brightness is zero and thus affect the contrast of the display substrate 100).

Therefore, in the embodiments of the present disclosure, by providing the light adjustment layer 3 that includes the first sub-light adjustment layer 31 and the second sub-light adjustment layer 32, it may not only be possible to improve the light efficiency of the display substrate 100 and thus reduce the power consumption of the display substrate 100, but it may also be possible to improve the contrast of the display substrate 100.

In some examples, a reflectivity of the reflective material in the first sub-light adjustment layer 31 is 85% to 95%. In this way, it may be effectively ensured that the first sub-light adjustment layer 31 has a good reflection effect on the light emitted by the light-emitting devices 2 and incident on the first sub-light adjustment layer 31, and it may be ensured that the display substrate 100 has a high light efficiency and low power consumption.

The material of the first sub-light adjustment layer 31 may include various kinds of materials. For example, the material of the first sub-light adjustment layer 31 includes at least one of a white ink, a white glue, or a metal material, but the material of the first sub-light adjustment layer 31 is not limited thereto. Herein, the reflective material is at least one of the white ink, the white glue, or the metal material. The white glue is, for example, a silica gel doped with titanium dioxide. The metal material is, for example, gold, copper or molybdenum, which have a high reflectivity.

The material of the second sub-light adjustment layer 32 may include various kinds of materials. For example, the material of the second sub-light adjustment layer 32 includes at least one of a black ink, a black glue, or a black photoresist material, but the material of the second sub-light adjustment layer 32 is not limited thereto. Herein, the light-absorbing material is at least one of the black ink, the black glue, or the black photoresist material.

In some examples, relative to the base 1, a relationship between the surface P1 of the first sub-light adjustment layer 31 away from the base 1 and the surfaces Q of the plurality of light-emitting devices 2 away from the base 1 may be set according to actual needs. For example, a difference between a distance D3 from the surface P1 of the first sub-light adjustment layer 31 away from the base 1 to the base 1 (i.e., a dimension of the first sub-light adjustment layer 31 in the direction perpendicular to the surface of the base 1 facing the light-emitting devices 2) and a distance D2 from the surfaces Q of the plurality of light-emitting devices 2 away from the base 1 to the base 1 (i.e., the thickness of the light-emitting devices 2) is −15 μm to 15 μm. That is, relative to the base 1, the surface P1 of the first sub-light adjustment 31 away from the base 1 may be 15 μm lower than the surfaces Q of the plurality of light-emitting devices 2 away from the base 1 at most, or the surface P1 of the first sub-light adjustment 31 away from the base 1 may be 15 μm higher than the surfaces Q of the plurality of light-emitting devices 2 away from the base 1 at most. In this way, it may be effectively ensured that the first sub-light adjustment layer 31 has a good reflection effect on the light emitted by the light-emitting devices 2 and incident on the first sub-light adjustment layer 31.

A thickness D4 of the second sub-light adjustment layer 32 (i.e., a dimension of the second sub-light adjustment layer 32 in the direction perpendicular to the surface of the base 1 facing the light-emitting devices 2) may be set according to actual needs. In some examples, the thickness D4 of the second sub-light adjustment layer 32 is 10 μm to 15 μm. For example, the thickness D4 of the second sub-light adjustment layer 32 is 10 μm, 11 μm, 13 μm, or 15 μm.

It will be noted that, the difference between the distance D3 from the surface P1 of the first sub-light adjustment layer 31 away from the base 1 to the base 1 and the distance D2 from the surfaces Q of the plurality of light-emitting devices 2 away from the base 1 to the base 1, and the thickness D4 of the second sub-light adjustment layer 32 need to be set in a way that the surface P2 of the second sub-light adjustment layer 32 away from the base 1 is flush with the surfaces Q of the plurality of light-emitting devices 2 away from the base 1 or is higher than the surfaces Q of the plurality of light-emitting devices 2 away from the base 1 relative to the base 1.

For example, if the difference between the distance D3 from the surface P1 of the first sub-light adjustment layer 31 away from the base 1 to the base 1 and the distance D2 from the surfaces Q of the plurality of light-emitting devices 2 away from the base 1 to the base 1 is set to −15 μm, then the thickness D4 of the second sub-light adjustment layer 32 is set to 15 μm. For another example, if the difference between the distance D3 from the surface P1 of the first sub-light adjustment layer 31 away from the base 1 to the base 1 and the distance D2 from the surfaces Q of the plurality of light-emitting devices 2 away from the base 1 to the base 1 is set to −10 μm, then the thickness D4 of the second sub-light adjustment layer 32 is set to 10 μm~15 μm.

A relative brightness of the solutions mentioned in the above embodiments of the present disclosure will be schematically described below.

For example, in the solution as shown in FIG. 2A, the light adjustment layer 3 is composed of a single layer of film, and the surface P of the light adjustment layer 3 away from the base 1 is flush with the surfaces Q of the light-emitting devices 2 away from the base 1. In the solution as shown in FIG. 7, the light adjustment layer 3 is composed of a single layer of film, and the surface P of the light adjustment layer 3 away from the base 1 is higher than the surfaces Q of the light-emitting devices 2 away from the base 1 relative to the base 1. In addition, in the solution as shown in FIG. 4, the light adjustment layer 3 is composed of two layers of films, and the surface P2 of the second sub-light adjustment layer 32 away from the base 1 is flush with the surfaces Q of the light-emitting devices 2 away from the base 1.

The relative brightness is defined as below: in a case where a same driving voltage is provided, if the brightness displayed on the display substrate 100 in a certain embodiment is used as a reference value of 100%, then the brightness displayed on the display substrate 100 in other embodiments is a relative brightness.

For example, if the brightness displayed on the display substrate 100 in the solution as shown in FIG. 2A is used as the reference value, then the relative brightness of the solution as shown in FIG. 7 is 25% to 50%, and the relative brightness of the solution as shown in FIG. 4 is 115% to 130%.

In some embodiments, as shown in FIG. 7, the display substrate 100 further includes a light reflecting layer 4 that covers the side walls 23 of each light-emitting device 2. The light reflecting layer 4 is configured to reflect the light incident from the light-emitting device 2 to the reflecting layer 4 back into the light-emitting device 2. That is, the light emitted by the light-emitting device 2 may be reflected at least once under an action of the light reflecting layer 4, so that the reflected light exits from the surface of the light-emitting device 2 facing away from the base 1. In this way, the reflecting layer 4 may be used to increase the amount of the light exiting from the surface of the light-emitting device 2 facing away from the base 1, which helps improve the light efficiency of the display substrate 100 and reduce the power consumption of the display substrate 100. Moreover, in a case where the light reflecting layer 4 is provided, the light adjustment layer 3 may be designed to be a single-layer structure, which simplifies a manufacturing process of the light adjustment layer 3.

Figure 10:
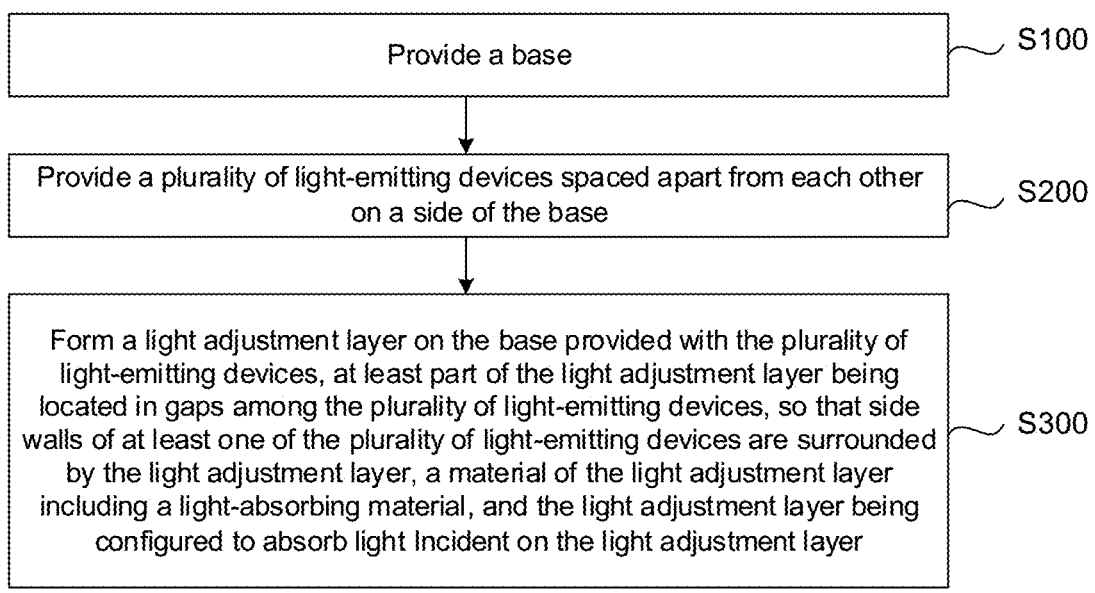
FIG. 10 is a flow diagram of a method of manufacturing a display substrate, in accordance with some embodiments of the present disclosure.

Some embodiments of the present disclosure provide a method of manufacturing a display substrate. As shown in FIG. 10, the method of manufacturing the display substrate includes S100 to S300.

In S100, a base is provided.

In S200, a plurality of light-emitting devices spaced apart from each other are provided on a side of the base.

In some examples, the plurality of light-emitting devices may be provided on the side of the base in a mass transfer manner. A plurality of solder joints may be provided between the plurality of light-emitting devices and the base, so that the plurality of light-emitting devices are electrically connected to the base through corresponding solder joints.

In some examples, the base is configured to provide a driving voltage for each light-emitting device, so that the light-emitting device can emit light when driven by the driving voltage. Therefore, the base provided in S100 includes a pixel driving circuit corresponding to each light-emitting device. The pixel driving circuit may be electrically connected to a corresponding light-emitting device through a corresponding solder joint.

In some examples, at least one layer of functional film (such as an insulating layer, a passivation layer or a planarization layer) is formed on the side of the base. The plurality of light-emitting devices are formed on a surface of the at least one layer of functional film away from the base.

In S300, a light adjustment layer is formed on the base provided with the plurality of light-emitting devices. At least part of the light adjustment layer is located in gaps among the plurality of light-emitting devices, so that side walls of at least one of the plurality of light-emitting devices are surrounded by the light adjustment layer. A material of the light adjustment layer includes a light-absorbing material. The light adjustment layer is configured to absorb light incident on the light adjustment layer.

The light adjustment layer may be of various structures. For example, the light adjustment layer is composed of a single layer of film. For another example, the light adjustment layer is composed of two layers of films. The structure of the light adjustment layer is not limited thereto.

Herein, a process flow of forming the light adjustment layer is related to the structure of the light adjustment layer.

In some embodiments, the light adjustment layer is composed of two layers of films.

Figure 11:
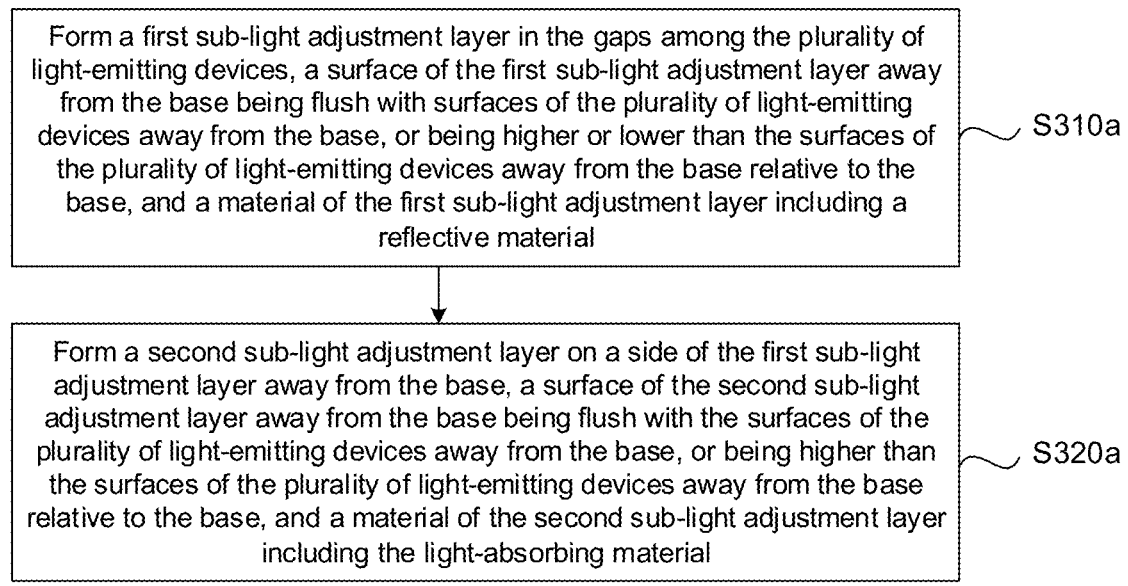
FIG. 11 is a flow diagram for forming a light adjustment layer, in accordance with some embodiments of the present disclosure.

As shown in FIG. 11, S300, in which the light adjustment layer is formed on the base provided with the plurality of light-emitting devices, includes S310a and S320a.

Figure 12:
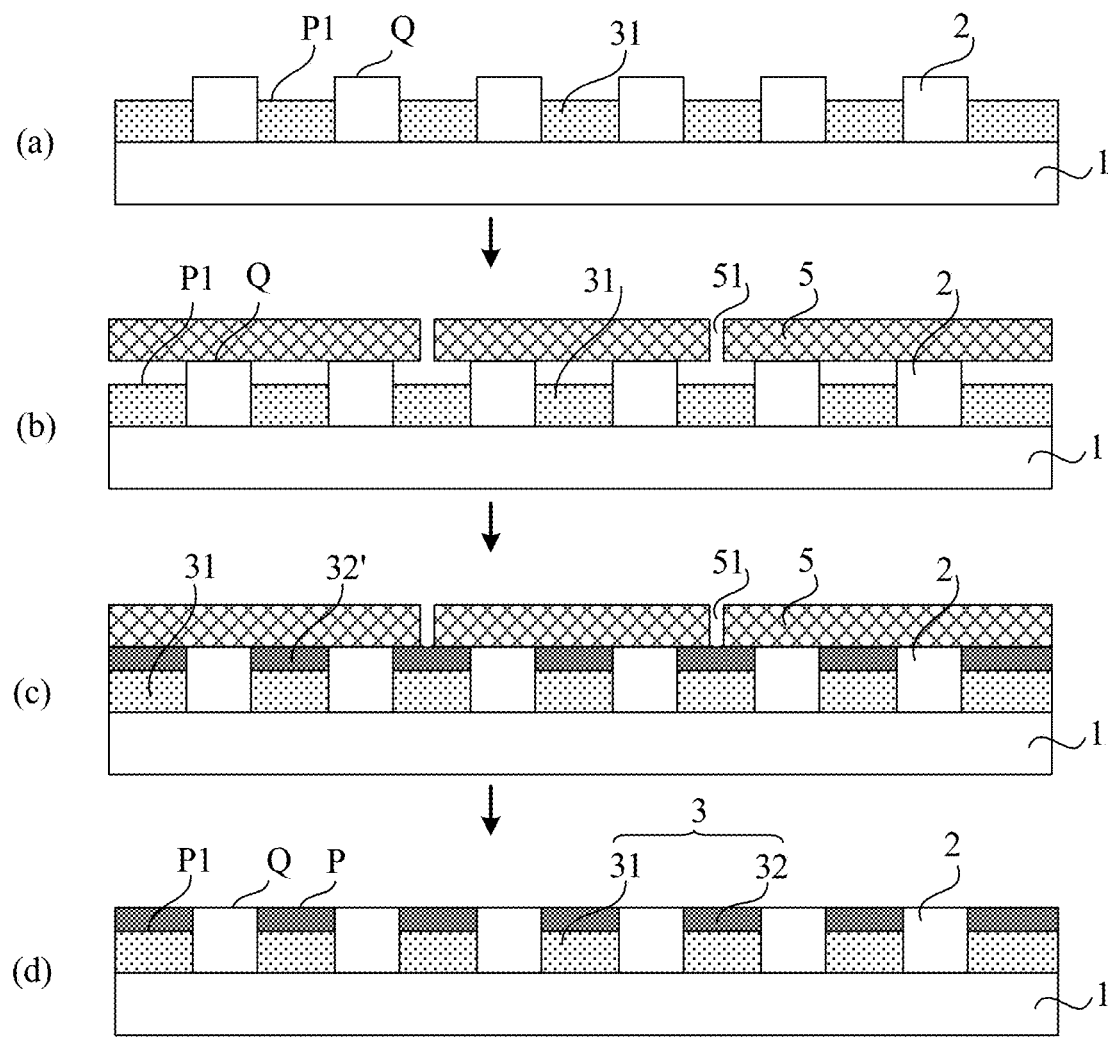
FIG. 12 is a diagram illustrating a fabrication process of forming the light adjustment layer shown in FIG. 11.
Figure 13:
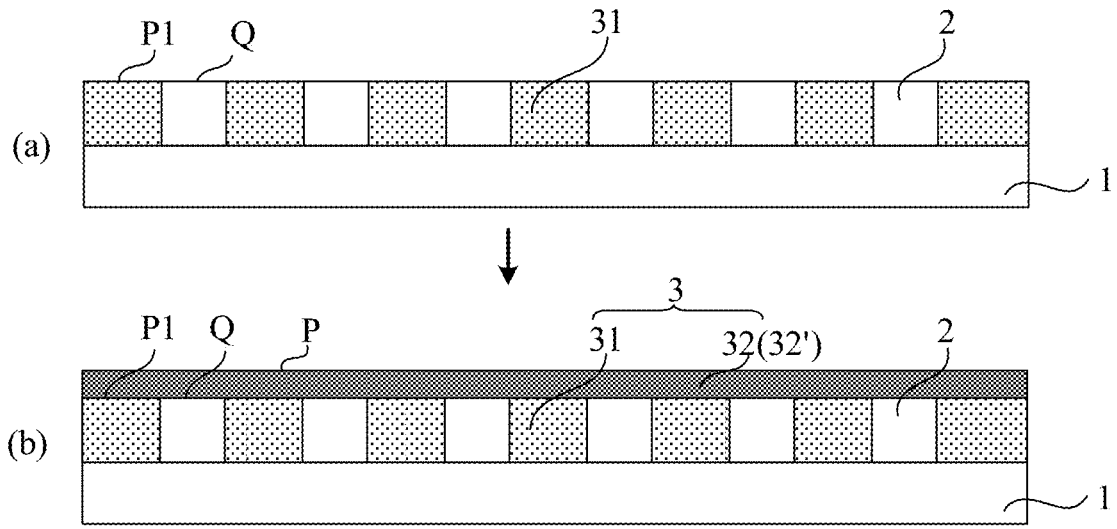
FIG. 13 is diagram illustrating another fabrication process of forming the light adjustment layer shown in FIG. 11.
Figure 14:
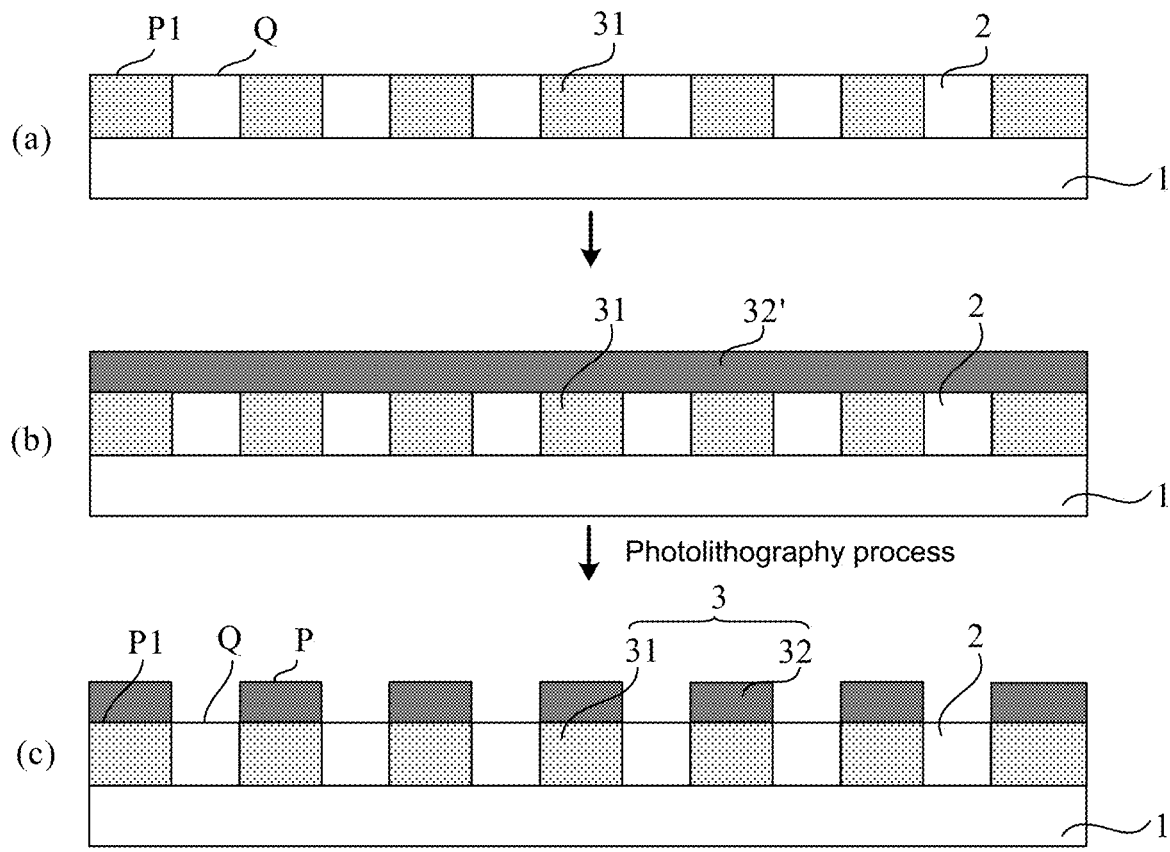
FIG. 14 is diagram illustrating yet another fabrication process of forming the light adjustment layer shown in FIG. 11.

In S310a, as shown in (a) of FIG. 13, (a) of FIG. 14, and (a) of FIG. 12, a first sub-light adjustment layer 31 is formed in the gaps among the plurality of light-emitting devices 2. A surface P1 of the first sub-light adjustment layer 31 away from the base 1 is flush with surfaces Q of the plurality of light-emitting devices 2 away from the base 1, or is higher or lower than the surfaces Q of the plurality of light-emitting devices 2 away from the base 1 relative to the base 1. A material of the first sub-light adjustment layer 31 includes a reflective material.

The material of the first sub-light adjustment layer 31 may include various kinds of materials. For example, the material of the first sub-light adjustment layer 31 includes at least one of a white ink, a white glue, or a metal material. Herein, the white glue is, for example, a silica gel doped with titanium dioxide. The metal material may include gold, copper, or molybdenum, which have a high reflectivity.

A process of forming the first sub-light adjustment layer 31 is related to the material(s) included in the first sub-light adjustment layer 31.

For example, in a case where the material of the first sub-light adjustment layer 31 includes a white ink or a white glue, since the white ink or white glue has fluid properties, the first sub-light adjustment layer 31 may be formed by any one of a glue dispensing process, a glue spraying process, or a 3D printing process.

For example, in a case where the material of the first sub-light adjustment layer 31 includes a metal material, the first sub-light adjustment layer 31 may be formed by a 3D printing process.

It will be noted that, in the case where the material of the first sub-light adjustment layer 31 includes a white ink or a white glue, S310a, in which the first sub-light adjustment layer 31 is formed in the gaps among the plurality of light-emitting devices 2, includes S3101a and S3102a.

In S3101a, a first sub-light adjustment film is formed in the gaps among the plurality of light-emitting devices 2 by any one of a glue dispensing process, a glue spray process, or a 3D printing process. Since the white ink or white glue has fluid properties, these materials will flow spontaneously in the gaps among the plurality of light-emitting devices 2, and thus will be uniformly filled in the gaps among the plurality of light-emitting devices 2 to form the first sub-light adjustment film.

In S3102a, the first sub-light adjustment film is baked to form the first sub-light adjustment layer 31.

For example, a baking temperature is within a range of 140° C. to 160° C., and a baking duration is within a range of one hour to two hours.

Herein, the first sub-light adjustment layer 31 formed by baking the first sub-light adjustment film, which is formed after the material having fluid properties flows spontaneously, may be of various shapes.

For example, as shown in FIG. 4, a thickness of a portion of the first sub-light adjustment layer 31 that is in contact with the side wall of the light-emitting device 2 (i.e., a dimension thereof in the direction perpendicular to the base 1) is greater than a thickness of a portion of the first sub-light adjustment layer 31 that is not in contact with the side wall of the light-emitting device 2 (i.e., a dimension thereof in the direction perpendicular to the base 1). In this case, the shape of the first sub-light adjustment layer 31 may be like that: a portion of the first sub-light adjustment layer 31 located in the middle is concave relative to portions thereof located at edges.

For another example, as shown in FIG. 8, a thickness of a portion of the first sub-light adjustment layer 31 that is in contact with the side wall of the light-emitting device 2 is less than a thickness of a portion of the first sub-light adjustment layer 31 that is not in contact with the side wall of the light-emitting device 2. In this case, the shape of the first sub-light adjustment layer may be like that: a portion of the first sub-light adjustment layer 31 located in the middle is convex relative to portion thereof located at edges.

By baking the first sub-light adjustment film, the first sub-light adjustment film that is in a liquid state may be converted into the first sub-light adjustment layer 31 that is in a solid state. In this way, the formed first sub-light adjustment layer 31 may have a relatively stable shape, so that the subsequent formation of a second sub-light adjustment layer 32 may not be affected, and the first sub-light adjustment layer 31 may not be contaminated during the formation of the second sub-light adjustment layer 32.

In S320a, a second sub-light adjustment layer 32 is formed on a side of the first sub-light adjustment layer 31 away from the base 1. A surface P2 of the second sub-light adjustment layer 32 away from the base 1 is flush with the surfaces Q of the plurality of light-emitting devices 2 away from the base 1, or is higher than the surfaces Q of the plurality of light-emitting devices 2 away from the base 1 relative to the base 1. A material of the second sub-light adjustment layer 32 includes the light-absorbing material.

Herein, the material of the second sub-light adjustment layer 32 includes at least one of a black ink, a black glue, or a black photoresist material.

There are various ways of forming the second sub-light adjustment layer 32. For example, the second sub-light adjustment layer 32 may be formed by any one of a glue dispensing process, a glue spraying process, a line coating process, a 3D printing process, a photolithography process, and an injection molding process.

It will be noted that, the material of the second sub-light adjustment layer 32 has fluid properties. S320a, in which the second sub-light adjustment layer 32 is formed in the gaps among the plurality of light-emitting devices 2, includes S3201a and S3202a.

In S3201a, a second sub-light adjustment film 32' is formed on the side of the first sub-light adjustment layer 31 away from the base 1.

For example, as shown in (b) of FIG. 13, the second sub-light adjustment film 32' is formed by any one of a glue dispensing process, a glue spraying process, a line coating process, and a 3D printing process.

For example, as shown in (b) and (c) of FIG. 12, the second sub-light adjustment film 32' is formed by an injection molding process. The process of forming the second sub-light adjustment film 32' by an injection molding process to is, for example, as follows: an injection molding mold 5 is provided on a side of the plurality of light-emitting devices 2 away from the base 1, and a vacuum treatment is performed to form a vacuum environment; then, the material of the second sub-light adjustment layer 32 is injected between the injection molding mold 5 and the first sub-light adjustment layer 31 through injection holes 51, so as to form the second sub-light adjustment film 32'. Herein, as shown in (d) of FIG. 12, the injection molding mold 5 may be removed after the second sub-light adjustment film 32' is cured through baking. As for the process of baking the second sub-light adjustment film 32', reference may be made to the description of S3102a.

In S3202a, the second sub-light adjustment film 32' is baked to form the second sub-light adjustment layer 32.

For example, a baking temperature is within a range of 140° C. to 160° C., and a baking duration is within a range of one hour to two hours.

By baking the second sub-light adjustment film 32', the second sub-light adjustment film 32' that is in a liquid state may be converted into the second sub-light adjustment layer 32 that is in a solid state. In this way, the formed second sub-light adjustment layer 31 may have a relatively stable shape.

In addition, a process of forming the second sub-light adjustment layer 32 by a photolithography process is, for example, as follows: as shown in (b) of FIG. 14, the second sub-light adjustment film 32' is formed by any one of a glue dispensing process, a glue spraying process, a line coating process, and a 3D printing process; and as shown in (c) of FIG. 14, the second sub-light adjustment film 32' is baked, and then the baked second sub-light adjustment film 32' is etched by a photolithography process to form the second sub-light adjustment layer 32.

In some other embodiments, the light adjustment layer is composed of a single layer of film.

Figure 15:
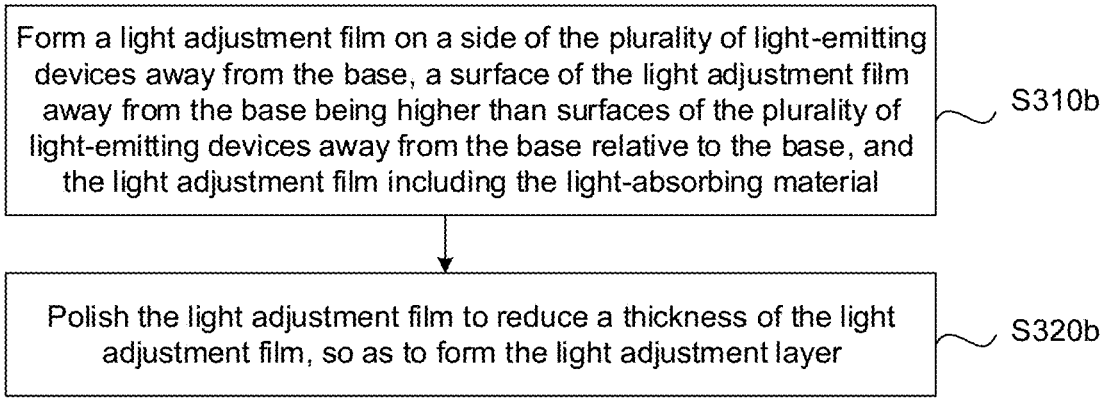
FIG. 15 is another flow diagram for forming a light adjustment layer, in accordance with some embodiments of the present disclosure.

As shown in FIG. 15, S300, in which the light adjustment layer is formed on the base provided with the plurality of light-emitting devices, includes S310b and S320b.

Figure 16:
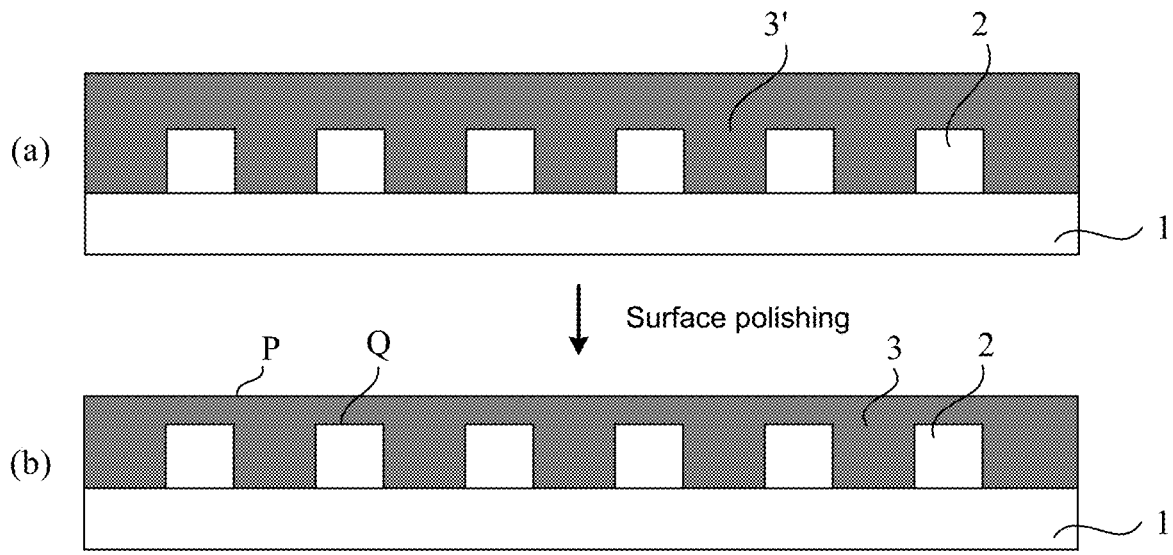
FIG. 16 is a diagram illustrating a fabrication process of forming the light adjustment layer shown in FIG. 15.

In S310b, as shown in (a) of FIG. 16, a light adjustment film 3' is formed in the gaps among the plurality of light-emitting devices 2 and on a side of the plurality of light-emitting devices 2 away from the base 1. A surface of the light adjustment film 3' away from the base 1 is higher than surfaces of the plurality of light-emitting devices 2 away from the base 1 relative to the base 1. The light adjustment film 3' includes the light-absorbing material.

For example, a process of forming the light adjustment film 3' includes any one of a glue dispensing process, a glue spraying process, a line coating process, and a 3D printing process.

In S320b, as shown in (b) of FIG. 16, the light adjustment film 3' is polished to reduce a thickness of the light adjustment film 3', so as to form the light adjustment layer 3.

For example, relative to the base 1, a surface P of the formed light adjustment layer 3 away from the base 1 is 0 µm to 50 µm higher than surfaces Q of the light-emitting devices 2 away from the base 1. In a case where the surface P of the formed light adjustment layer 3 away from the base 1 is 0 µm higher than the surfaces Q of the light-emitting devices 2 away from the base 1, the surfaces P and Q are flush with each other.

Here, after S310b and before S320b, the step of forming the light adjustment layer on the base provided with the plurality of light-emitting devices further includes: baking the light adjustment film 3', so that the light adjustment film 3' turns from a liquid state to a solid state, which is convenient for polishing the surface of the light adjustment film 3' away from the base 1.

A grinding process may be adopted for polishing. In this way, the surface P of the formed light adjustment layer 3 away from the base 1 may be more planarized (for example, the surface fluctuates within a range of −5 µm to 5 µm), thereby avoiding a problem of uneven display of the manufactured display substrate.

In addition, in yet some other embodiments, in a case where the light adjustment layer is composed of a single layer of film, the step of forming the light adjustment layer on the base provided with the plurality of light-emitting devices includes: forming a light adjustment film in the gaps among the plurality of light-emitting devices, and baking the light adjustment film, so as to form the light adjustment layer. A surface of the light adjustment layer away from the base is flush with surfaces of the plurality of light-emitting devices facing away from the base, or is lower than the surfaces of the plurality of light-emitting devices facing away from the base.

Herein, a process of forming the light adjustment film may include any one of a glue dispensing process, a glue spraying process, a line coating process, a 3D printing process, a photolithography process, and an injection molding process. A baking temperature may be within a range of 140° C. to 160° C., and a baking duration may be within a range of one hour to two hours.

Figure 17:
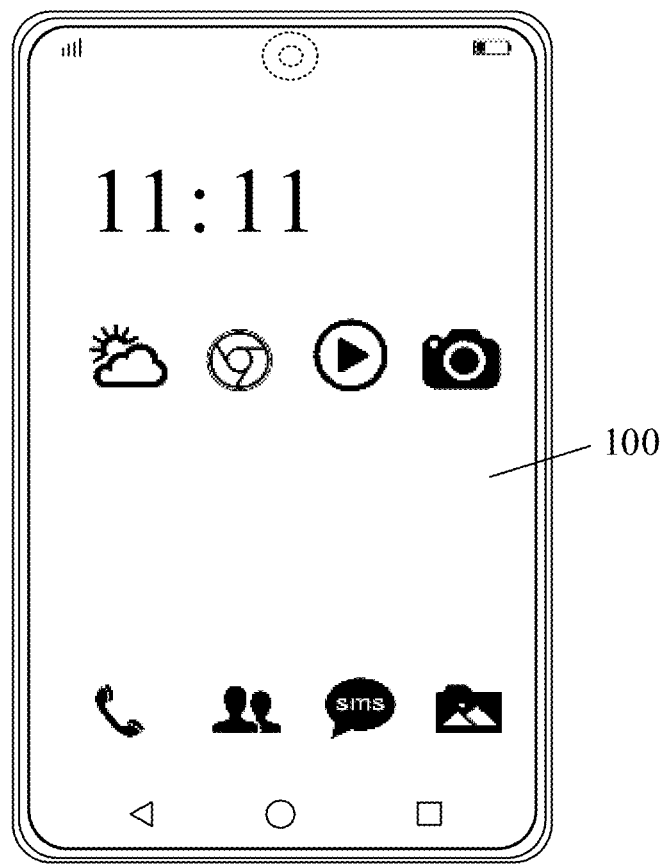
FIG. 17 is a structural diagram of a display device, in accordance with some embodiments of the present disclosure.

Some embodiments of the present disclosure provide a display device 200. As shown in FIG. 17, the display device 200 includes the display substrate 100 as provided in some of the above embodiments.

The display substrate 100 included in the display device 200 has the same structure and beneficial effects as the display substrate 100 provided in some of the above embodiments, and details will not be repeated here.

In some embodiments, the display device 200 is an electronic paper, a mobile phone, a tablet computer, a television, a display, a notebook computer, a digital frame, a navigator, or any other product or component having a display function.

The foregoing descriptions are merely specific implementation manners of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A display substrate, comprising:
    a base;
    a plurality of light-emitting devices disposed on a side of the base, the plurality of light-emitting devices being spaced apart from each other; and
    a light adjustment layer, at least part of the light adjustment layer being located in gaps among the plurality of light-emitting devices, so that side walls of at least one of the plurality of light-emitting devices are surrounded by the light adjustment layer, a material of the light adjustment layer including a light-absorbing material, and the light adjustment layer being configured to absorb light incident on the light adjustment layer.

2. The display substrate according to claim 1, wherein a thickness of a portion of the light adjustment layer located in the gaps among the plurality of light-emitting devices is 0.5 to 1.5 times a thickness of the plurality of light-emitting devices.

3. The display substrate according to claim 1, wherein the material of the light adjustment layer includes at least one of a black ink, a black glue, or a black photoresist material.

4. The display substrate according to claim 1, wherein an absorption coefficient of the material of the light adjustment layer is $2 \times 10^{-5}$ m$^{-1}$ to 0.8 m$^{-1}$.

5. The display substrate according to claim 1, wherein a surface of the light adjustment layer away from the base is flush with surfaces of the plurality of light-emitting devices away from the base, or, is higher than the surfaces of the plurality of light-emitting devices away from the base relative to the base in a thickness direction of the base.

6. The display substrate according to claim 5, wherein relative to the base, the surface of the light adjustment layer away from the base is 0 μm to 50 μm higher than the surfaces of the plurality of light-emitting devices away from the base in the thickness direction of the base.

7. The display substrate according to claim 1, wherein the light adjustment layer includes:
    a first sub-light adjustment layer located in the gaps among the plurality of light-emitting devices, a surface of the first sub-light adjustment layer away from the base being flush with surfaces of the plurality of light-emitting devices away from the base, or being higher or lower than the surfaces of the plurality of light-emitting devices away from the base relative to the base, a material of the first sub-light adjustment layer including a reflective material, and the first sub-light adjustment layer being configured to reflect light incident from the light-emitting devices to the first sub-light adjustment layer back into the light-emitting devices; and
    a second sub-light adjustment layer disposed on a side of the first sub-light adjustment layer away from the base, a surface of the second sub-light adjustment layer away from the base being flush with the surfaces of the plurality of light-emitting devices away from the base, or being higher than the surfaces of the plurality of light-emitting devices away from the base relative to the base, a material of the second sub-light adjustment layer including the light-absorbing material, and the second sub-light adjustment layer being configured to absorb light incident on the second sub-light adjustment layer.

8. The display substrate according to claim 7, wherein a reflectivity of the reflective material in the first sub-light adjustment layer is 85% to 95%.

9. The display substrate according to claim 7, wherein the material of the first sub-light adjustment layer includes at least one of a white ink, a white glue, or a metal material.

10. The display substrate according to claim 7, wherein in a thickness direction of the base, a difference between a distance from the surface of the first sub-light adjustment layer away from the base to the base, and a distance from the surfaces of the plurality of light-emitting devices away from the base to the base is −15 μm to 15 μm.

11. The display substrate according to claim 7, wherein a thickness of the second sub-light adjustment layer is 10 μm to 15 μm.

12. The display substrate according to claim 7, wherein an orthogonal projection of the second sub-light adjustment layer on the base is non-overlapping with orthogonal projections of the plurality of light-emitting devices on the base; or
    the orthogonal projections of the plurality of light-emitting devices on the base are located within the orthogonal projection of the second sub-light adjustment layer on the base.

13. The display substrate according to claim 1, further comprising a light reflecting layer that covers side walls of each of the plurality of light-emitting devices.

14. A method of manufacturing a display substrate, the method comprising:
    providing a base;
    providing a plurality of light-emitting devices spaced apart from each other on a side of the base; and
    forming a light adjustment layer on the base provided with the plurality of light-emitting devices, at least part of the light adjustment layer being located in gaps among the plurality of light-emitting devices, so that side walls of at least one of the plurality of light-emitting devices are surrounded by the light adjustment layer, a material of the light adjustment layer including a light-absorbing material, and the light adjustment layer being configured to absorb light incident on the light adjustment layer.

15. The method of manufacturing the display substrate according to claim 14, wherein forming the light adjustment layer on the base provided with the plurality of light-emitting devices, includes:
    forming a first sub-light adjustment layer in the gaps among the plurality of light-emitting devices, a surface of the first sub-light adjustment layer away from the base being flush with surfaces of the plurality of light-emitting devices away from the base, or being higher or lower than the surfaces of the plurality of light-emitting devices away from the base relative to the base, and a material of the first sub-light adjustment layer including a reflective material; and
    forming a second sub-light adjustment layer on a side of the first sub-light adjustment layer away from the base, a surface of the second sub-light adjustment layer away from the base being flush with the surfaces of the plurality of light-emitting devices away from the base, or being higher than the surfaces of the plurality of light-emitting devices away from the base relative to the base, and a material of the second sub-light adjustment layer including the light-absorbing material.

16. The method of manufacturing the display substrate according to claim 15, wherein
    the first sub-light adjustment layer is formed by any one of a glue dispensing process, a glue spraying process, and a 3D printing process; and the second sub-light adjustment layer is formed by any one of a glue dispensing process, a glue spraying process, a line coating process, a 3D printing process, a photolithography process, and an injection molding process.

17. The method of manufacturing the display substrate according to claim 14, wherein forming the light adjustment layer on the base provided with the plurality of light-emitting devices, includes:

forming a light adjustment film in the gaps among the plurality of light-emitting devices and on a side of the plurality of light-emitting devices away from the base, a surface of the light adjustment film away from the base being higher than surfaces of the plurality of light-emitting devices away from the base relative to the base, and the light adjustment film including the light-absorbing material; and polishing the light adjustment film to reduce a thickness of the light adjustment film, so as to form the light adjustment layer.

18. A display device, comprising the display substrate according to claim 1.

19. The display substrate according to claim 1, wherein a surface of the light adjustment layer away from the base is lower than the surfaces of the plurality of light-emitting devices away from the base relative to the base in a thickness direction of the base.

20. The display substrate according to claim 19, wherein relative to the base, in the thickness direction of the base, a difference between a distance from the surfaces of the plurality of light-emitting devices away from the base to the base, and a distance from the surface of the light adjustment layer away from the base to the base is greater than 0 μm and less than or equal to 15 μm.

* * * * *